US012642153B2

(12) United States Patent
Chang et al.

(10) Patent No.: US 12,642,153 B2
(45) Date of Patent: May 26, 2026

(54) DISCRETE DUAL PADS FOR A CIRCUIT

(71) Applicant: SEMICONDUCTOR COMPONENTS INDUSTRIES, LLC, Scottsdale, AZ (US)

(72) Inventors: Jie Chang, Suzhou (CN); XiaoYing Yuan, Suzhou (CN); Keunhyuk Lee, Suzhou (CN); Jerome Teysseyre, Scottsdale, AZ (US); Leo Gu, Suzhou (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 488 days.

(21) Appl. No.: 18/181,950

(22) Filed: Mar. 10, 2023

(65) Prior Publication Data

US 2024/0304529 A1     Sep. 12, 2024

(51) Int. Cl.
| | |
|---|---|
| *H01L 23/495* | (2006.01) |
| *H01L 21/56* | (2006.01) |
| *H01L 23/31* | (2006.01) |
| *H01L 25/00* | (2006.01) |
| *H01L 25/07* | (2006.01) |

(52) U.S. Cl.
CPC ........ *H01L 23/49575* (2013.01); *H01L 21/56* (2013.01); *H01L 23/3107* (2013.01); *H01L 23/49503* (2013.01); *H01L 25/072* (2013.01); *H01L 25/50* (2013.01); *H01L 23/49562* (2013.01)

(58) Field of Classification Search
CPC  H01L 23/49575; H01L 21/56; H01L 23/4334
USPC .......................................................... 257/77
See application file for complete search history.

(56) References Cited

U.S. PATENT DOCUMENTS

| | | | |
|---|---|---|---|
| 9,263,563 | B2 | 2/2016 | Otremba et al. |
| 9,716,057 | B1 | 7/2017 | Zhang et al. |
| 9,960,153 | B2 | 5/2018 | Akiyama |
| 2016/0155726 | A1 | 6/2016 | Kanazawa et al. |

(Continued)

FOREIGN PATENT DOCUMENTS

| | | |
|---|---|---|
| JP | 63142843 | 6/1988 |

OTHER PUBLICATIONS

International Search Report and Written Opinion for counterpart application No. PCT/US2023/084537, mailed May 27, 2024, 15 pages.

*Primary Examiner* — Quoc D Hoang
(74) *Attorney, Agent, or Firm* — Brake Hughes Bellermann LLP

(57)     ABSTRACT

Implementations of high-power semiconductor device modules are described, including automotive power transistor assemblies for use in power amplifier circuits such as a cascode circuit. In some implementations, power amplifier circuit components are provided on separate semiconductor die attached to discrete dual die attach pads. A separation between the die attach pads, as well as a through-hole, provide sufficient isolation between the die to permit operation of the circuit at high voltages without relying on a thick multi-layer direct bond copper (DBC) isolation structure. In some implementations, higher voltage operation can be supported by a thin multi-layer, resin coated copper DAP in which the top layer is split.

20 Claims, 9 Drawing Sheets

(56)          References Cited

U.S. PATENT DOCUMENTS

| | | | | |
|---|---|---|---|---|
| 2016/0211246 A1* | 7/2016 | Akiyama | ............... | H10D 30/83 |
| 2017/0287820 A1* | 10/2017 | Ahlers | ................ | H01L 21/4825 |
| 2020/0211940 A1* | 7/2020 | Tuncer | ................ | H01L 21/4821 |
| 2022/0336331 A1* | 10/2022 | Ho | ....................... | H01L 23/4951 |
| 2023/0005874 A1* | 1/2023 | Pan | ................... | H01L 23/49575 |

* cited by examiner

900

902
Form split lead frame body sections having die attach pads (DAPs)

904
Attach die to DAP

906
Couple first die to second die to form a two-stage amplifier circuit

908
Encapsulate two-stage amplifier with molding compound

910
Attach resin coated copper (RCC) layer to split lead frame body

912
Attach back plane to RCC layer

DISCRETE DUAL PADS FOR A CIRCUIT

TECHNICAL FIELD

This description relates to assembling and packaging semiconductor device modules, e.g., semiconductor device assemblies, semiconductor device module assemblies, etc. More specifically, this description relates to high-power semiconductor device modules designed to operate at high voltages with improved performance and reliability.

BACKGROUND

Semiconductor device assemblies, such as assemblies including power semiconductor devices, can be implemented using multiple semiconductor die, substrates (e.g., direct-bonded metal substrates, die attach pads (DAPs)), electrical interconnections, and a molding compound. Power transistors can include, for example, insulated-gate bipolar transistors (IGBTs), power metal-oxide-semiconductor field effect transistors (MOSFETs), and so forth. Electrical interconnections within a high-power semiconductor device module can include, for example, bond wires, conductive spacers, and conductive clips. A polymer molding compound can serve as an encapsulant to protect components of the device assembly. Such power transistor devices can be used in various applications, including automotive and/or industrial applications.

SUMMARY

In some aspects, an apparatus includes: a split lead frame having split lead frame body sections separated by an isolation region; an electronic circuit including a first device in a first die coupled to a second device in a second die, the first die and the second die arranged side-by-side on the upper surface, the first die being disposed on the first section and the second die being disposed on the second section; and an insulator in contact with the upper surface and a lower surface of the split lead frame.

In some aspects, the first die is made of silicon and the second die is made of silicon carbide (SiC).

In some aspects, the insulator is a molding compound disposed within the isolation region.

In some aspects, a dam bar is disposed in each of the two sections to block flow of the molding compound.

In some aspects, the isolation region is less than or equal to 2.0 mm wide.

In some aspects, the electronic circuit is configured to operate at a voltage up to about 600 V.

In some aspects, the electronic circuit is a two-stage amplifier.

In some aspects, the electronic circuit is a SiC based cascode circuit.

In some aspects, an apparatus includes: a lead frame body having an upper surface and a lower surface, the lead frame body being split into a first section and a second section separated by a gap; an electronic circuit coupled to the upper surface, the electronic circuit including a first device included in a first die coupled to a second device included in a second die, the first die coupled to a die attach pad (DAP) in the first section of the lead frame body and the second die coupled to a DAP in the second section of the lead frame body; and an insulating layer coupled to the lower surface of the lead frame body.

In some aspects, the insulating layer is a resin coated copper layer.

In some aspects, the apparatus further includes a backplane coupled to the insulating layer.

In some aspects, the gap is an isolation region filled with a molding compound.

In some aspects, the isolation region is less than or equal to 2.0 mm wide.

In some aspects, the electronic circuit is an amplifier circuit configured to operate at a high voltage up to about 1700 V.

In some aspects, the apparatus further includes a kelvin temperature sensor.

In some aspects, a method includes: forming a lead frame having a split lead frame body in which an insulator separates first and second sides of the split lead frame body; attaching a first semiconductor die to a die attach pad (DAP) of the first side of the split lead frame body and a second semiconductor die to a DAP of a second side of the split lead frame body; coupling the first semiconductor die to the second semiconductor die to form a two-stage amplifier circuit; and encapsulating the two-stage amplifier circuit with a molding compound to form a package around the split lead frame body.

In some aspects, the method further includes, prior to encapsulating, attaching a resin coated copper (RCC) layer to the split lead frame body.

In some aspects, the method further includes attaching a backplane to the RCC layer.

In some aspects, the method further includes forming a dam bar attached to the lead frame body to restrict flow of the molding compound.

Figure 1B:
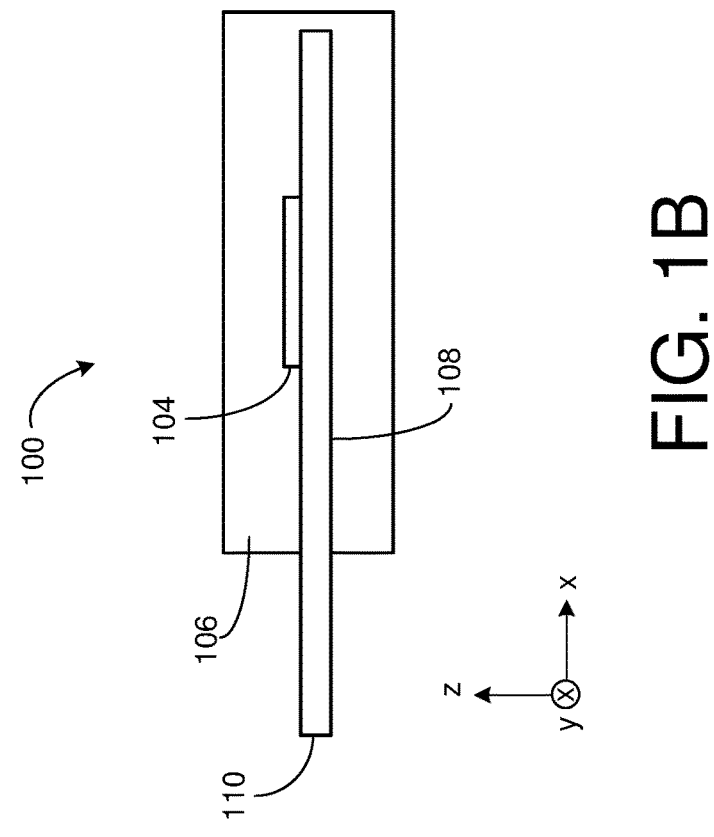
FIG. 1B is a cross-sectional view of the simplified block diagram shown in FIG. 1A, according to an implementation of the present disclosure.

Aspects of the present disclosure are best understood from the following detailed description when read with the accompanying figures. It is noted that, in accordance with common practice in the industry, various features are not necessarily drawn to scale. Dimensions of the various features may be arbitrarily increased or reduced for clarity of discussion. In the drawings, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings but are provided for context between related views. Also, not all like elements in the drawings are specifically referenced with a reference symbol when multiple instances of an element are illustrated.

DETAILED DESCRIPTION

This disclosure relates to implementations of semiconductor device assemblies including power transistor assemblies for use in power amplifier circuits such as, for example, a cascode circuit. In some implementations, the power amplifier circuit device components are on separate semiconductor die attached to discrete dual die attach pads. A separation between the die attach pads allows for sufficient isolation between the die to permit operation at high voltages without relying on a thick multi-layer direct bond copper (DBC) structure. In some implementations, higher voltage operation can be supported instead by a thin multi-layer DAP in which the top layer is split. Such modifications to the die attach pad structure can reduce packaging costs.

In an assembly process for a semiconductor device module, a semiconductor die containing one or more transistor devices is first attached to a die attach pad of a lead frame. Contact or bond pads of the semiconductor die are then individually attached by wire bonding to contact pads at ends of the leads of the lead frame. After the wire bonding operation is completed, the lead frame is placed in a mold. The mold is provided with a reservoir for containing a quantity of an insulating molding compound. The molding compound is then injected into the mold to encapsulate the die attach pad(s) and the semiconductor die(s).

In some applications, power transistor devices can be used to implement electronic circuits, e.g., inverters or power amplifiers used in electrical vehicles (EVs) and/or hybrid electrical vehicles (HEVs). However, in some semiconductor device assemblies, each device can be formed on a separate die. For example, a two-stage electronic circuit can be implemented with two die either stacked or arranged side-by-side. A stacked arrangement has the advantage of greater isolation between the dies. But the stacked die size requirement is larger, which incurs more cost. On the other hand, a side-by-side arrangement may not be feasible if sufficient isolation cannot be provided between the two high-power devices.

Figure 1A:
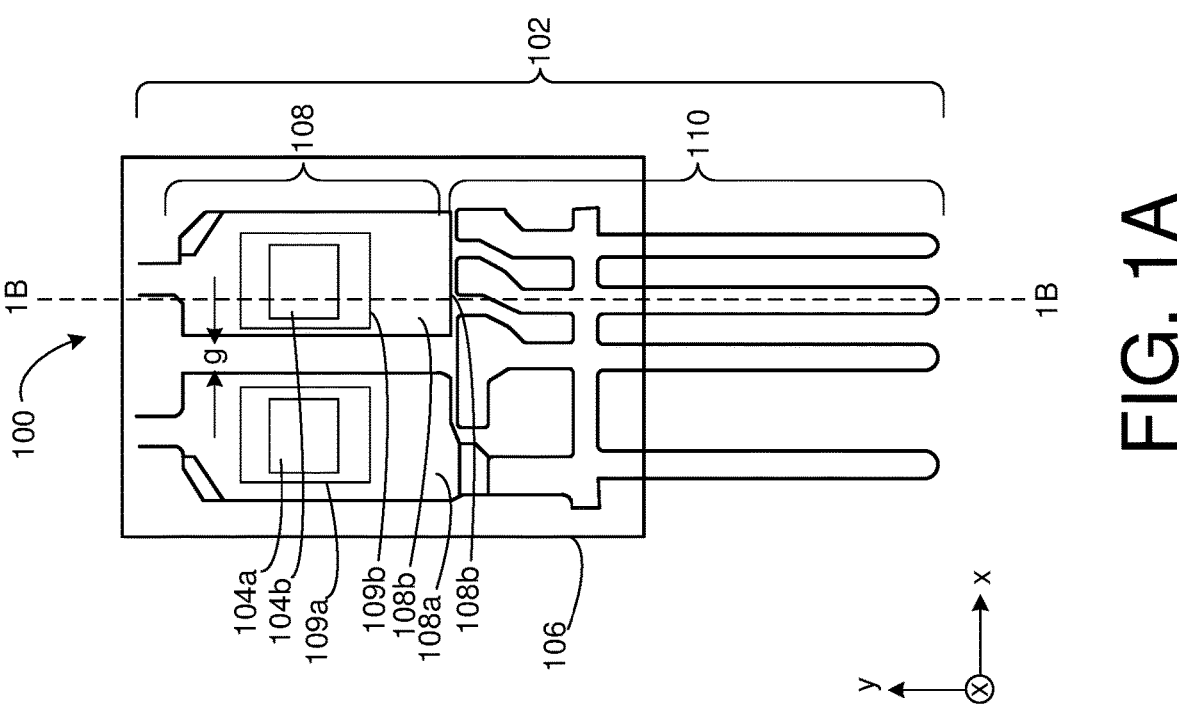
FIG. 1A is a plan view (e.g., top-side plan view) of a simplified block diagram representing a high-power semiconductor device module, according to an implementation of the present disclosure.

FIG. 1A shows a top-side plan view of high-power semiconductor device module 100, according to some implementations of the present disclosure. High-power semiconductor device module 100 includes a lead frame 102, one or more semiconductor die 104 (two shown, 104a and 104b), and a molding compound 106 that encapsulates the semiconductor die 104 and a portion of the lead frame 102. The lead frame 102 includes a split lead frame body 108 having two sections 108a and 108b, one or more die attach pads (DAPs) 109 (two shown, 109a and 109b) and leads 110 (four shown) that provide signal paths to and from each semiconductor die 104. The lead frame 102 can be formed (e.g., fabricated by cutting, stamping, etc.) from a thin sheet of metal, e.g., copper.

In some implementations, each of the DAPs 109 can be a multi-layer DAP of a direct bond copper (DBC) type or, alternatively, of a direct plating copper (DPC) type, both of which provide an isolation substrate underneath the attached semiconductor die 104. DBC and/or DPC type die attach pads can include three layers: top and bottom layers made of copper, and an insulating layer, e.g., an aluminum oxide ($Al_2O_3$) ceramic layer, between the two copper layers. Each die attach pad 109 may also serve as a heat sink to dissipate heat generated by semiconductor die 104. However, because these multi-layer isolation substrates are more expensive, and they occupy more volume in the encapsulated package, it can be advantageous to use thinner die attach pads 109 that are made of a single layer of copper, while isolating the DAPs from one another using alternative techniques.

In some implementations, a first semiconductor die 104a attached to DAP 109a can be disposed within, and aligned along, a plane of the lead frame body section 108a. Likewise, a second die 104b attached to DAP 109b can be disposed within and aligned along a plane of the lead frame body section 108*b*, such that die 104*a* and die 104*b* are side-by-side.

The two lead frame body sections 108*a,b* can be separated by a gap g that forms an isolation region to physically and electrically isolate the DAPs 109*a,b* and each semiconductor die 104*a,b* from one another. When the package is completed with the addition of the molding compound 106, the molding compound 106 will fill the gap g. Such isolation can permit safe and reliable operation of semiconductor devices in the die 104 at voltages suitable for high-power applications such as power amplifiers used in electric vehicles. Such operating voltages can be in a range of hundreds to thousands of volts sustained by a gap that is in a range of about 1.2 mm to about 1.6 mm wide. A smaller gap may be sufficient to sustain smaller voltages, e.g., voltages up to about 400 V to about 600 V, while a larger gap may be needed to sustain larger voltages above about 1500 V to about 1700 V. The lead frame body sections 108*a,b* can be of substantially equal or different sizes, areas, or shapes as long as the gap g of at least 1.6 mm is maintained along the length of the lead frame body sections 108 in the y-direction. Likewise, the DAPs 109*a,b* can be of substantially equal or different sizes, areas, or shapes.

FIG. 1B shows a side cross-sectional view of the high-power semiconductor device module 100 shown in FIG. 1A, according to some implementations of the present disclosure. The cross-sectional view shown in FIG. 1B is along cut 1B-1B, parallel to the y-z plane. FIG. 1B shows that the semiconductor die 104*a,b* are attached, e.g., mounted, to upper surfaces of single layer copper split lead frame sections 108*a,b* of the lead frame 102. FIG. 1B also shows that the molding compound 106 surrounds and insulates both the upper surface and the lower surface of the die attach pad(s) 109*a,b* as well as the semiconductor die 104, while the leads 110 extend out from the molded package. Using single layer die attach pads 109*a,b* ensures there is sufficient clearance between energized elements of high-power semiconductor device module 100 and the top and bottom exterior surfaces of the molding compound 106.

Figure 2:
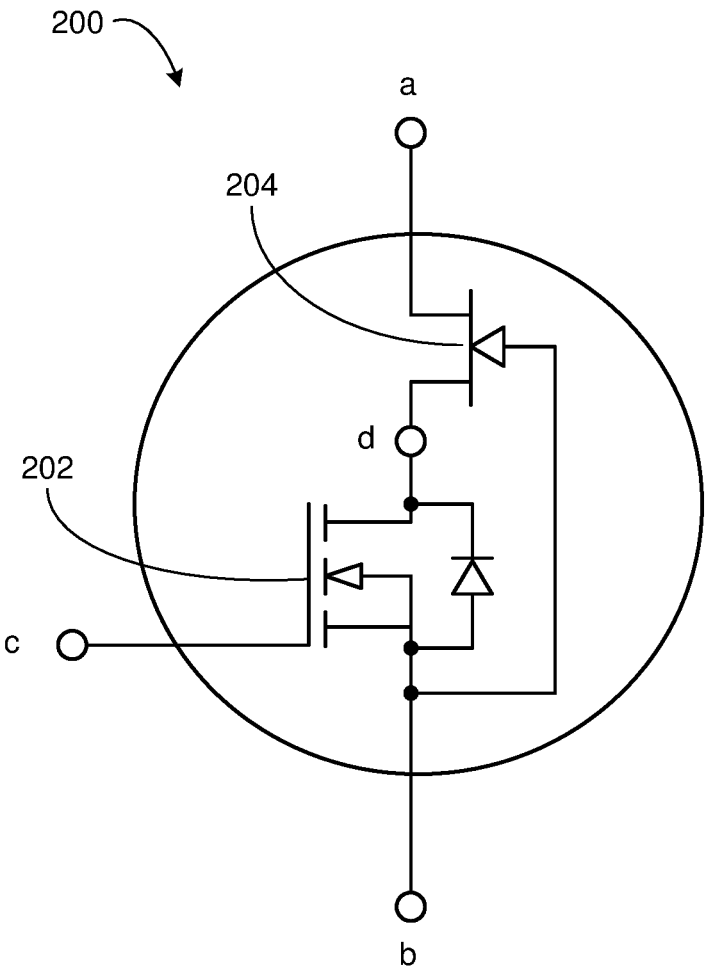
FIG. 2 is a schematic diagram of a two-stage amplifier in the form of a cascode circuit.

FIG. 2 shows a schematic diagram of a cascode circuit 200, according to some implementations of the present disclosure. The cascode circuit 200 is a type of two-stage amplifier circuit, including a first transistor device 202 and a second transistor device 204 that can be configured to produce a high gain as well as a high bandwidth. Cascode circuit 200 has three terminals a, b, and c. In some implementations, terminal a can be coupled to a power source, terminal b can be connected to ground, and a control signal can be applied to terminal c. In the cascode circuit 200, the first transistor device 202 can be coupled in parallel with the second transistor device 204 at terminal b and at point d.

In some implementations, the first transistor device 202 can be fabricated in the first semiconductor die 104*a* (shown in FIG. 1A), and the second transistor device 204 can be fabricated in the second semiconductor die 104*b* (shown in FIG. 1A), for attachment to separate die attach pads 108*a* and 108*b*, respectively of the high-power semiconductor device module 100 (shown in FIG. 1A). In some implementations, the two semiconductor dies 104*a* and 104*b* can include different substrate materials. For example, the first transistor device 202 can be fabricated on a silicon substrate of semiconductor die 104*a*, while the second transistor device 204 can be fabricated on a silicon carbide (SiC) substrate of semiconductor die 104*b*. Alternatively, the cascode circuit can be SiC-based such that both die have SiC substrates. Other semiconductor materials can be used for either or both substrates, e.g., gallium (Ga), gallium nitride (GaN), aluminum gallium nitride (AlGaN), gallium arsenide (GaAs), aluminum gallium arsenide (AlGaAs), indium phosphide (InP), and so forth.

Figure 3A:
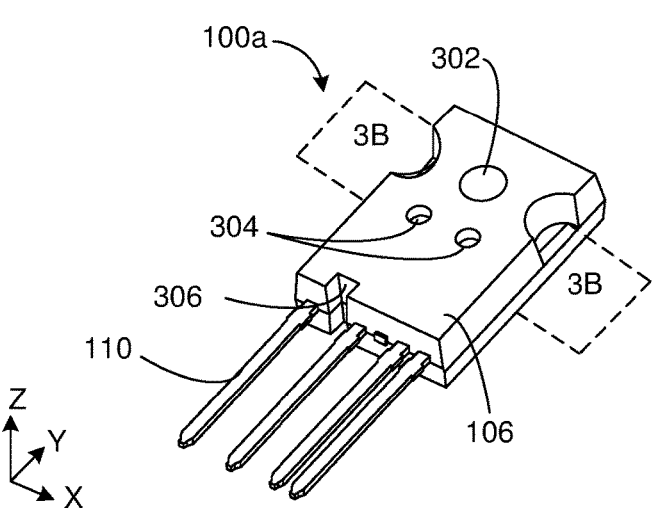
FIG. 3A is a top-side perspective view of a packaged high-power semiconductor device module, according to an implementation of the present disclosure.
Figure 3B:
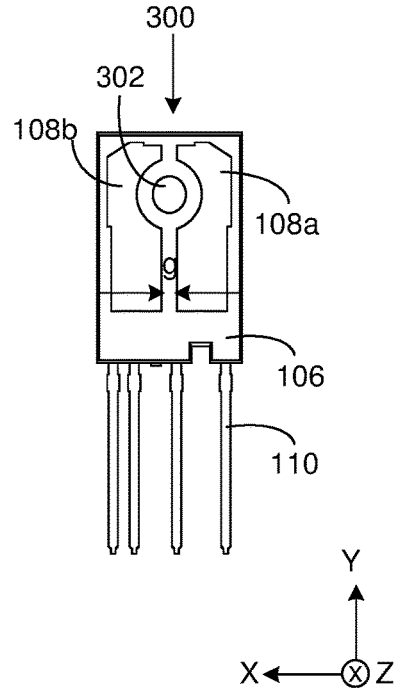
FIG. 3B is a bottom-side cross-sectional view of the high-power semiconductor device module shown in FIG. 3A along cut 3B-3B, according to an implementation of the present disclosure.

FIGS. 3A and 3B show a perspective view and a cross-sectional view, respectively, of an example 100*a* of the high-power semiconductor device module 100 shown in FIGS. 1A and 1B, according to some implementations of the present disclosure. FIG. 3A shows the exterior package of the high-power semiconductor device module 100*a*, encapsulated by the molding compound 106. The cross-sectional view shown in FIG. 3B is along cut 3B-3B parallel to the x-y plane, as seen from the back side of the high-power semiconductor device module 100*a*. FIG. 3B illustrates that, in the example high-power semiconductor device module 100*a*, the lead frame body sections 108*a* and 108*b* bend around a keyhole-shaped cutout 300. The keyhole-shaped cutout 300 includes the gap g and a screw hole 302 that penetrates the whole package (e.g., that has an opening on each of the package and lumen between the openings), including the full thickness of molding compound 106. FIG. 3B shows the underside of a split pad arrangement in which both the gap g and the screw hole 302 serve to isolate split lead frame body sections 108*a* and 108*b* from one another. In this example, split lead frame body sections 108*a* and 108*b* are formed around screw hole 302, while also maintaining an isolation region in the gap g around screw hole 302. The screw hole 302 can accommodate a screw for installation of the high-power semiconductor device module 100. As indicated in FIG. 3B, the perimeter of the head of a screw can make contact with, and exert pressure on, molding compound 106 to hold the high-power semiconductor device module 100 in place.

The package shown in FIG. 3A further includes two indents 304. The indents 304 penetrate an upper portion of the thickness of molding compound 106. The indents 304 accommodate retraction pins in the mold that support each side of the split lead frame body sections 108*a,b* to secure the mold in place while setting the molding compound 106.

Figure 3C:
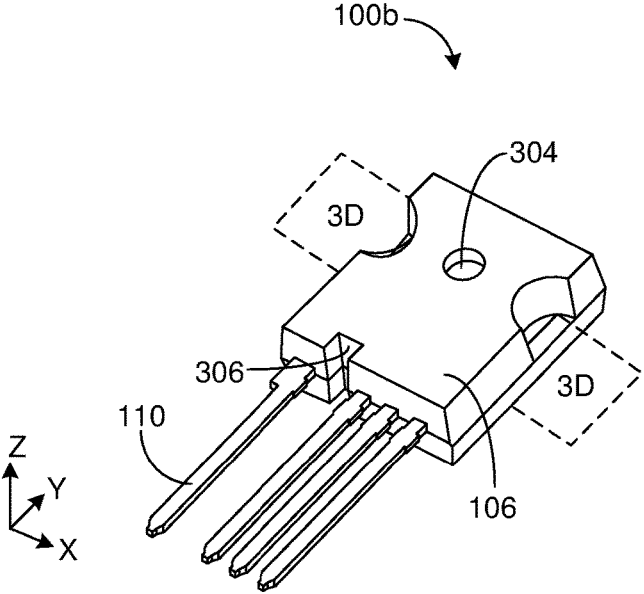
FIG. 3C is a top-side perspective view of a packaged high-power semiconductor device module, according to an implementation of the present disclosure.
Figure 3D:
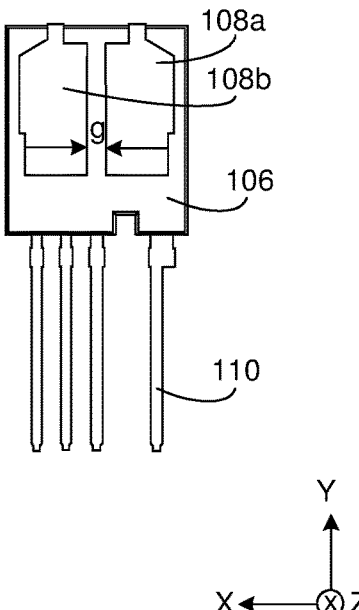
FIG. 3D is a bottom-side cross-sectional view of the high-power semiconductor device module shown in FIG. 3C along cut 3D-3D, according to an implementation of the present disclosure.

FIGS. 3C and 3D show a perspective view and a cross-sectional view, respectively, of an example 100*b* of the high-power semiconductor device module 100 shown in FIGS. 1A and 1B, according to some implementations of the present disclosure. FIG. 3C shows the exterior package of the high-power semiconductor device module 100*b*, encapsulated by the molding compound 106. The cross-sectional view shown in FIG. 3D is along cut 3D-3D parallel to the x-y plane, as seen from the back side of the high-power semiconductor device module 100*b*. The package shown in FIG. 3C includes a single indent 304, which penetrates an upper portion of the thickness of molding compound 106. The single indent 304 accommodates a central retraction pin to hold the split die attach pads 108*a,b* in place. The package shown in FIG. 3C does not include a screw hole. FIG. 3D shows a split pad arrangement in which the gap g serves to isolate split lead frame body sections 108*a* and 108*b* from one another. In this example, the shape of split lead frame body sections 108*a,b* is approximately rectangular.

In some implementations, the high-power semiconductor device module 100 includes in the molding compound 106 a notch 306. The notch 306 can provide additional isolation between selected leads 110.

Figures 4A, 4B, 4C:
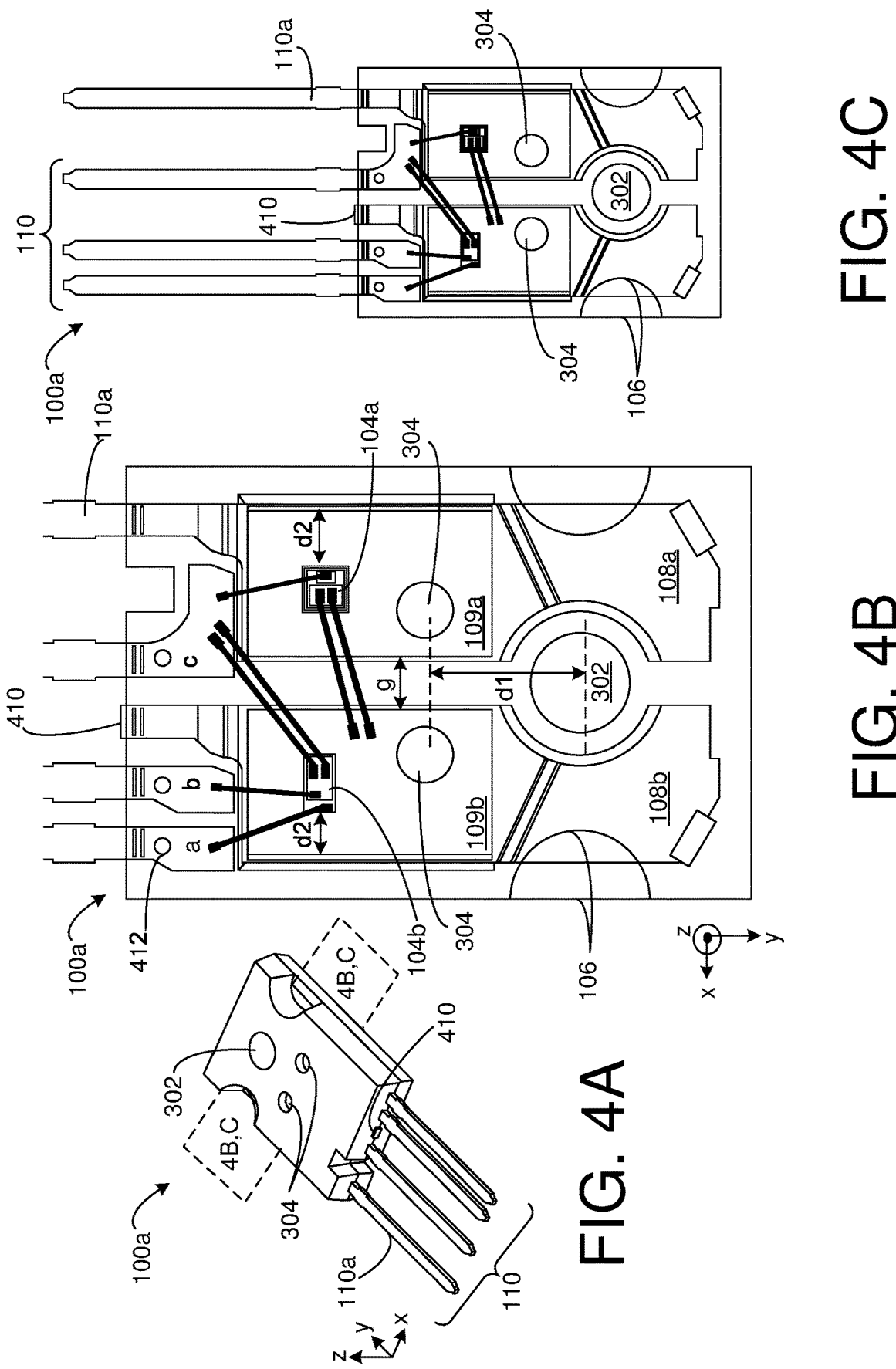
FIG. 4A is an exterior view of a packaged high-power semiconductor device module, according to an implementation of the present disclosure.
FIG. 4B is a rotated and magnified cross-sectional view along cut 4B,C-4B,C showing the internal structure of the high-power semiconductor device module shown in FIG. 4A, according to an implementation of the present disclosure.
FIG. 4C is a rotated high level cross-sectional view along cut 4B,C-4B,C of the high-power semiconductor device module shown in FIG. 4A, according to an implementation of the present disclosure.

FIGS. 4A-4C show a perspective view and two cross-sectional views, respectively, of the example high-power semiconductor device module 100*a* according to some implementations of the present disclosure shown in FIGS. 3A and 3B above, that includes screw hole 302. FIG. 4A reproduces FIG. 3A. FIG. 4B is a magnified view of FIG. 4C. The cross-sectional views shown in FIGS. 4B and 4C are along cut 4B,C-4B,C, parallel to the x-y plane, as seen from the top side of the high-power semiconductor device module 100a. FIGS. 4B and 4C are rotated through 180 degrees so that leads 110 extend upward instead of downward as shown in FIG. 4A.

FIGS. 4B and 4C show details of the high-power semiconductor device module 100a as an implementation of cascode circuit 200. Four leads 110 are aligned with the y-axis of the package. Lead 110a provides a connection path to die 104a via split lead frame section 108a and die attach pad 109a. DAP 109b is coupled to a dummy lead 410 that can extend slightly beyond the outer edge of the molding compound 106. The dummy lead 410 can provide structural support to the split lead frame body section 108b. The dummy lead 410 fills space between adjacent leads, which, otherwise would have empty space between them. Through holes 412 (three shown) are provided for molding compound 106 to fill so that the leads 110 will interlock with the molding compound 106.

At least three of the leads 110, are configured to accept external connections. One of the leads 110 can provide a power connection to terminal a of the cascode circuit 200; another one of the leads 110 can deliver a control signal to terminal c of the cascode circuit 200; another one of the leads 110 can provide a connection between terminal b of the cascode circuit 200 and a kelvin temperature sensor on the second die 104b. In some implementations, the lead coupled to terminal b is used as a sense connector for the kelvin temperature sensor that allows for a high switching speed with low loss and high efficiency. In some implementations, a wiring pattern for such connections can be laid out such that the angles of the wires with respect to the +/−y-axis, and therefore with respect to the leads, are in a range of about 12 degrees to about 106 degrees.

In a specific, non-limiting example, the elements of the high-power semiconductor device module 100a shown in FIG. 4B can have dimensions as specified below. Of course, in other implementations, other dimensions can be used, and the following discussion is provided by way of example and for purposes of illustration.

In some implementations, the radius of each indent 304 is in a range of about 0.9 mm to about 1.1 mm, and a center-to-center distance d1 in the y-direction between the screw hole 302 and the indents 304 is in a range of about 5.0 mm to about 6.0 mm. In some implementations, the centers of the indents 304 are positioned at a distance of about 2.0 mm to about 3.0 mm from the center of gap g. In some implementations, the semiconductor die 104a,b are centered on their respective discrete die attach pads 109a,b such that there is between about 1.5 and about 2.0 mm of clearance d2 between the edge of each die 104 and the nearest edge of the corresponding die attach pad 109. In some implementations, the total x-y-z dimensions of the molded package for the high-power semiconductor device module 100a can be in a range of about 15.0 mm×22.0 mm×4.0 mm to about 16.0× 23.0 mm×6.0 mm. In some implementations, the x-y area dimensions of each of the split lead frame body sections 108a,b for the high-power semiconductor device module 100b can be about 5.0 mm×16.0 mm to about 6.0 mm×17.0 mm. In some implementations, the pitch of leads 110 can be about 2.2 mm, 4.42 mm, or 5.08 mm.

Figures 5A, 5B, 5C:
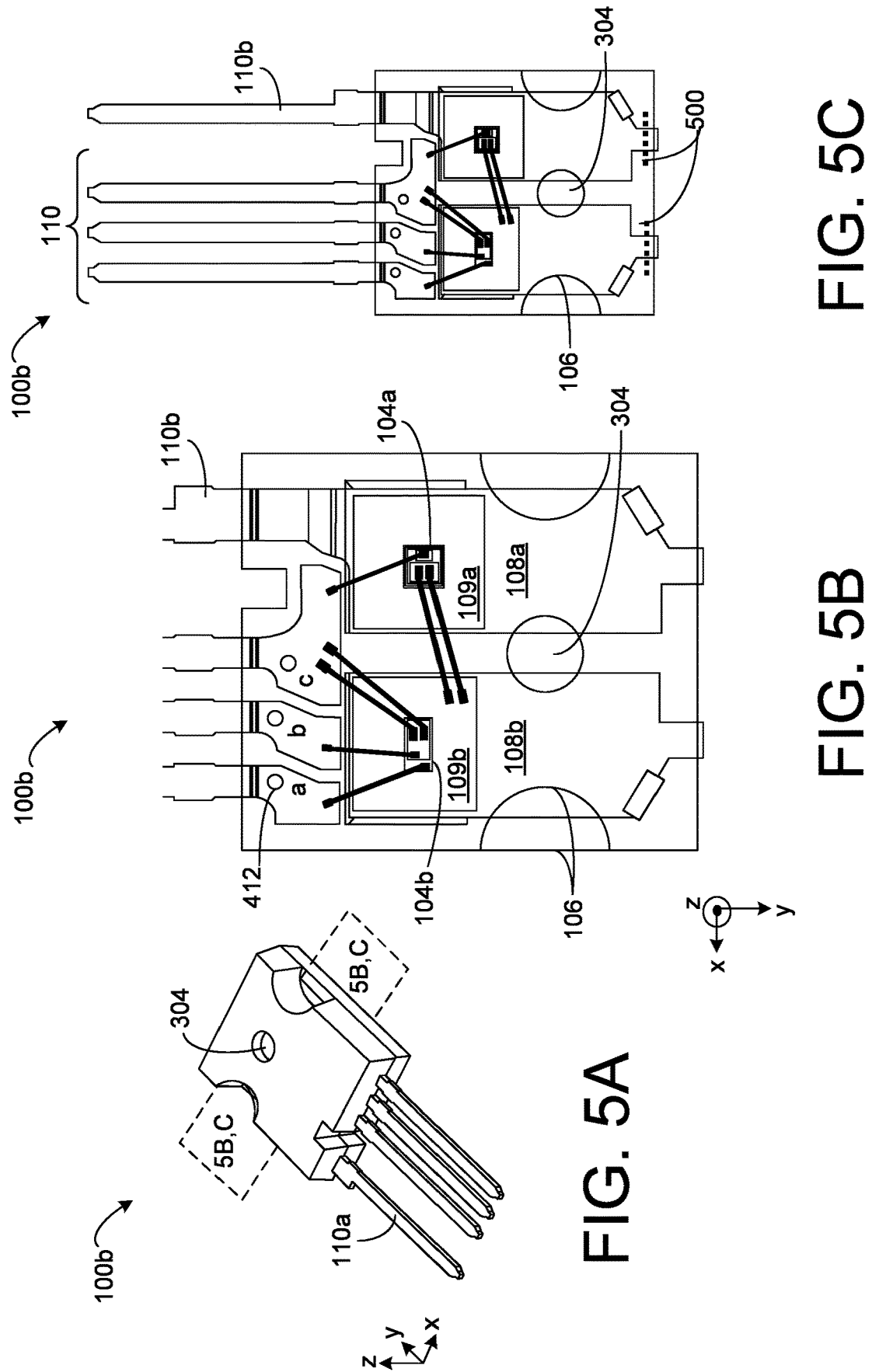
FIG. 5A is an external view of a packaged high-power semiconductor device module, according to an implementation of the present disclosure.
FIG. 5B is a rotated and magnified cross-sectional view along cut 5B,C-5B,C of the high-power semiconductor device module shown in FIG. 5A, according to an implementation of the present disclosure.
FIG. 5C is a rotated high level cross-sectional view along cut 5B,C-5B,C of the high-power semiconductor device module shown in FIG. 5A, according to an implementation of the present disclosure.

FIGS. 5A-5C show a perspective view and two cross-sectional views, respectively, of the example high-power semiconductor device module 100b according to the implementation of the present disclosure shown in FIGS. 3C and 3D above. FIG. 5A reproduces FIG. 3C. FIG. 5B is a magnified view of FIG. 5C. The cross-sectional views shown in FIGS. 5B and 5C are along cut 5B,C-5B,C, parallel to the x-y plane, as seen from the top side of the high-power semiconductor device module 100a. FIGS. 5B and 5C are rotated through 180 degrees so that leads 110 extend upward instead of downward as shown in FIG. 5A.

FIGS. 5B and 5C show details of the high-power semiconductor device module 100b as an implementation of cascode circuit 200. In some implementations, a volume of molding compound 106 forming a package around the high-power semiconductor device module 100b can be smaller than a corresponding package of the high-power semiconductor device module 100a.

FIG. 5C is shown with dam bars 500 temporarily in place, indicated by dashed lines. The dam bars 500 can be used during an injection molding process that forms the package around the high-power semiconductor device module 100b. The dam bars 500 can be disposed so as to restrict or block a flow of encapsulant, e.g., a liquid epoxy molding compound (EMC), from exiting the mold before the molding compound 106 solidifies. As described below, the dam bars 500 can be removed during the manufacturing process, e.g., by a trimming tool, so that the dam bars 500 are not present in the finished high-power semiconductor device module 100b.

In FIGS. 5B and 5C, the leads 110 can be substantially aligned with the y-axis of the package. Lead 110b provides a connection path to die attach pad 109a. In some implementations, the die attach pad 109b is not coupled to a lead. Three of the leads 110 can be configured to accept external connections. For example, a first lead 110 can provide a ground connection to terminal b of the cascode circuit 200; a second lead 110 can provide a power connection to terminal a of the cascode circuit 200; and a third lead 110 can deliver a control signal to terminal c of the cascode circuit 200. In some implementations, a wiring pattern for such connections can be laid out such that the angles of the wires with respect to the y-axis, and therefore with respect to the leads 110, are in a range of about 20 degrees to about 106 degrees.

In a specific, non-limiting example, the elements of the high-power semiconductor device module 100b shown in FIG. 5B can have dimensions as specified below. Of course, in other implementations, other dimensions can be used, and the following discussion is provided by way of example and for purposes of illustration.

In some implementations, the radius of the indent 304 is in a range of about 1.0 mm to about 2.0 mm and the distance from center of the indent 304 to the edge of the package is in a range of about 5.0 mm to about 7.0 mm. In some implementations, the indent 304 is centered on the gap g. In some implementations, the semiconductor die 104a,b are centered on their respective discrete die attach pads 108a,b such that there is about 1.5-2.0 mm of clearance between the edge of each die and the nearest edge of the corresponding die attach pad. In some implementations, the total x-y-z dimensions of the molded package for the high-power semiconductor device module 100b are in a range of about 15.0 mm×175.0 mm×4.0 mm to about 16.0 mm×180.0 mm×6.0 mm. In some implementations, the area dimensions of each split lead frame body section 108a,b for the high-power semiconductor device module 100b are in a range of about 5.0 mm×11.0 mm to about 6.0 mm×12.0 mm. In some implementations, the pitch of leads 110 is in a range of about 2.0 mm to about 3.0 mm, and the pitch of lead 110a is in a range of about 4.5 mm to about 5.5 mm.

In some implementations, e.g., according to examples 100a and 100b shown above, the high-power semiconductor device module 100 is designed to operate at voltages up to about 400V to about 600V. For operating voltages exceeding about 600V, additional isolation may be needed as will be described below.

Figures 6A, 6B:
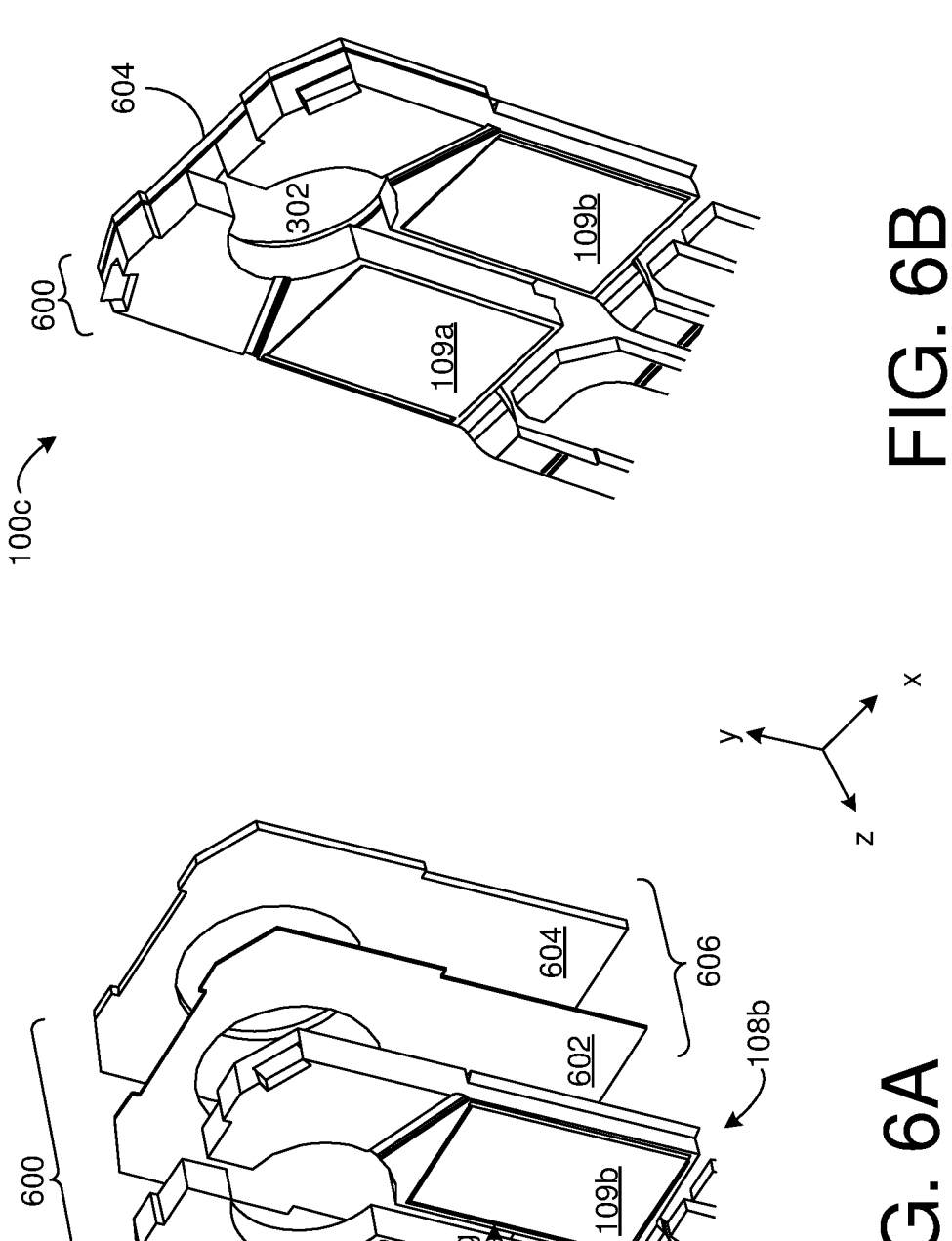
FIG. 6A is an exploded view of a multi-layer split lead frame body, according to an implementation of the present disclosure.
FIG. 6B is a perspective view of the multi-layer split lead frame body shown in FIG. 6A, according to an implementation of the present disclosure.

FIGS. 6A and 6B show a lead frame of a high-power semiconductor device module 100c, according to some implementations of the present disclosure. The high-power semiconductor device module 100c can operate at voltages of up to about 1500 V to about 1700 V when additional isolation is provided by a multi-layer split lead frame body 600. In some implementations, the exterior encapsulation package for high-power semiconductor device module 100c resembles the example of high-power semiconductor device module 100a shown in FIGS. 3A and 4A that includes screw hole 302. FIG. 6A is an exploded view of the multi-layer split lead frame body 600; FIG. 6B shows the multi-layer split lead frame body 600 after assembly is complete. The multi-layer split lead frame body 600 includes the split lead frame body sections 108a,b as a top layer. In addition, the multi-layer split lead frame body 600 includes a resin layer 602 and an additional copper layer 604, which together form a resin coated copper (RCC) layer 606. In some implementations, the RCC layer 606 has a thickness in a range of about 0.1 mm to about 0.2 mm. In some implementations, resin layer 602 can be made of an insulator, e.g., a polymer material, a polyimide, or an epoxy having a thickness in a range of about 0.05 mm to about 0.3 mm. The split lead frame body sections 108a,b, together with the RCC layer 606, form the multi-layer split lead frame body 600. The RCC layer 606 has external dimensions that substantially match those of the split lead frame body sections 108a,b.

In some implementations, the RCC layer 606 can be affixed to the split lead frame body sections 108a,b by an adhesive. In some implementations, the RCC layer 606 is continuous across the gap g, that is, the RCC layer is in one piece (not split). In some implementations, the screw hole 302 extends through the multi-layer split lead frame body 600 so that when the package is completed, the molding compound 106 will close the screw hole 302 to provide isolation between the two sections of the split lead frame body sections 108a,b.

Figures 7A, 7B, 7C:
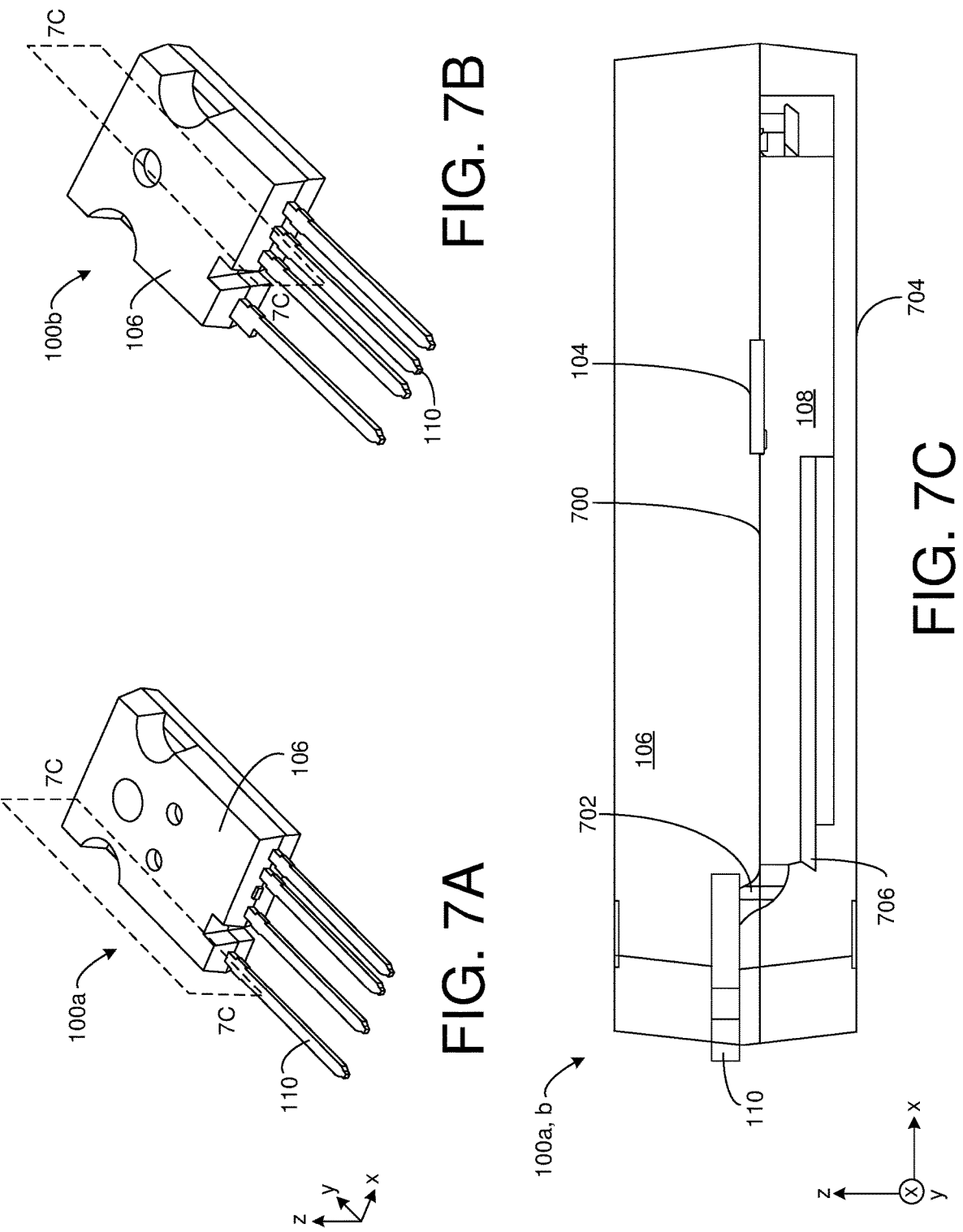
FIG. 7A is an external view of a packaged high-power semiconductor device module, according to an implementation of the present disclosure.
FIG. 7B is an external view of a packaged high-power semiconductor device module, according to an implementation of the present disclosure.
FIG. 7C is a cross-sectional view along cut 7C-7C of a portion of a packaged high-power semiconductor device module according to an implementations of the present disclosure.

FIGS. 7A and 7B reproduce the external views of high-power semiconductor device modules 100a and 100b, as shown in FIGS. 4A and 5A, respectively. FIG. 7C shows a cross-sectional view along cut 7C-7C, parallel to the y-z plane, representing high-power semiconductor device modules 100a and 100b, according to some implementations of the present disclosure. In particular, the high-power semiconductor device modules 100a and 100b, having single layer DAPs, are represented in FIG. 7C, in which the cut 7C-7C intersects a lead 110. In each of these implementations, there is sufficient clearance between an upper surface 700 of the lead frame body 108 and the upper surface of the molding compound 106, to accommodate attaching the leads 110. In some implementations, a curved lead frame portion 702 can couple lead 110 to the lead frame body 108, which can be above or below the plane of the lead 110. The molding compound 106 surrounds the lead frame body 108 so that the molding compound 106 is in contact with a lower surface 704 of the lead frame body 108 as well as the upper surface 700. In some implementations, each one of the lead frame body sections 108a,b can incorporate a mold lock feature 706 for use in securing the mold during the injection molding process.

Figures 8A, 8B:
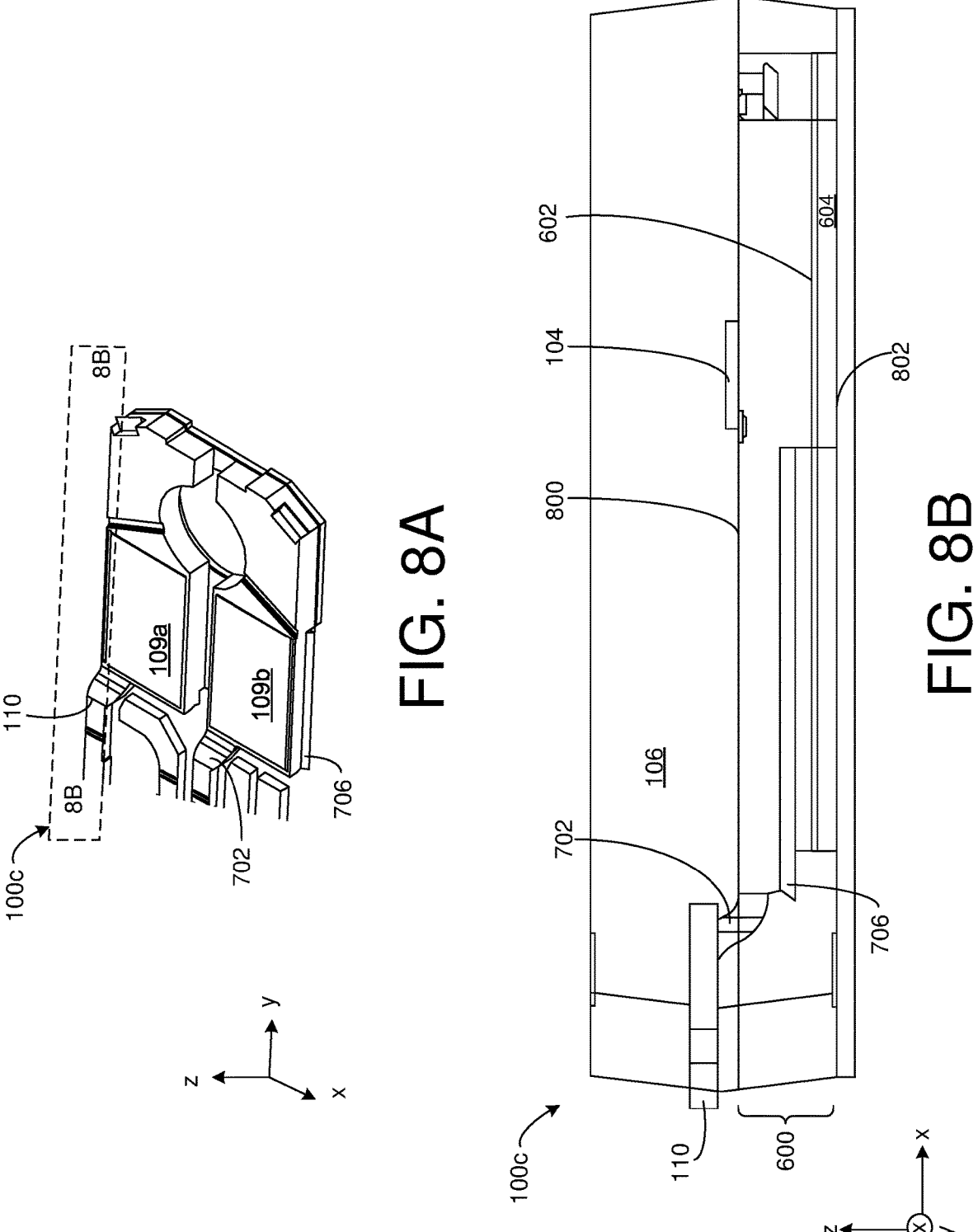
FIG. 8A is a perspective top-side view of the multi-layer split lead frame body shown in FIG. 6B.
FIG. 8B is a cross-sectional view along cut 8B-8B of a portion of a packaged high-power semiconductor device module featuring the multi-layer split lead frame body shown in FIGS. 6A and 6B, according to an implementation of the present disclosure.

FIG. 8A reproduces the perspective view of the assembled multi-layer DAP, as shown in FIG. 6B. FIG. 8B shows a cross-sectional view along cut line A-A' representing high-power semiconductor device module 100c, according to an implementation of the present disclosure. In particular, the high-power semiconductor device module 100c, having a three-layer DAPs is represented in FIG. 8B. In this example, as in the example above in FIG. 7C, there is sufficient clearance between an upper surface 800 of the multi-layer DAP 600 and the upper surface of the molding compound 106, to accommodate attaching the leads 110. The molding compound 106 surrounds the multi-layer DAP 600 so that the molding compound 106 is in contact with a lower surface 802 of the multi-layer DAP 600 as well as the upper surface 800.

Figure 9:
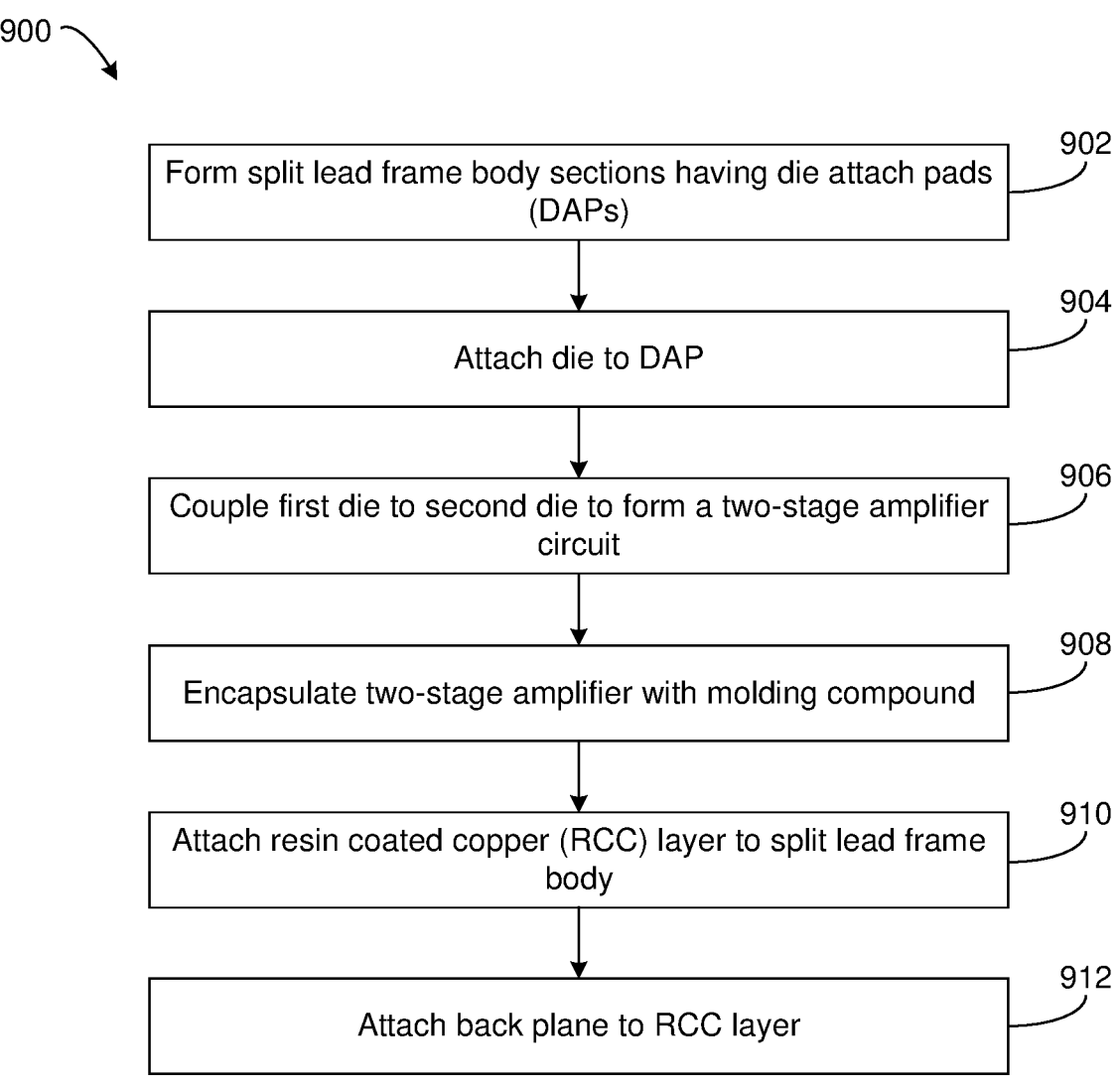
FIG. 9 is a flow chart illustrating a method for producing a high-power semiconductor device module, such as the modules shown in FIG. 4A, FIG. 5A, or FIG. 6A.

FIG. 9 is a flow chart illustrating a method 900 for fabricating the high-power semiconductor device module 100, according to some implementations of the present disclosure. Operations of method 900 can be performed in a different order, or not performed, depending on specific applications. It is noted that method 900 may not produce a complete high-power semiconductor device module 100. Accordingly, it is understood that additional processes can be provided before, during, or after method 900, and that some of these additional processes may be briefly described herein.

Operations 902-908 can be carried out to form high-power semiconductor device modules 100a and 100b, according to some implementations as described above. Operations 902-912 can be carried out to form high-power semiconductor device module 100c, according to some implementations as described above.

At 902, the method 900 includes forming the lead frame 102 with split lead frame body sections 108a,b. The lead frame 102 can be made from rolled metal sheeting, for example, rolled copper or aluminum, that is cut or stamped with a repeating pattern, e.g., a repeating pattern of the lead frame 102 as shown, for example, in FIG. 1A, or FIG. 6A. A sheet of lead frames 102 can then be separated into single lead frames 102, by cutting or scoring. Separate die attach pads 109a,b are formed on corresponding top surfaces of the lead frame body sections 108a,b.

At 904, the method 900 includes attaching a semiconductor die 104 to each die attach pad 109a,b on each of the of the split lead frame body sections 108a,b of the lead frame 102. In some implementations, attaching the semiconductor die 104 can be accomplished by mounting, or bonding, the die to the die attach pad 109a, e.g., using a bonding adhesive, e.g., a conductive bonding adhesive. In some implementations, semiconductor die 104 can be coupled with the die attach pad 109, using e.g., a soldering reflow process, a sintering process, or other appropriate process.

At 906, the method 900 includes coupling the semiconductor die 104a to the semiconductor die 104b to form a two-stage amplifier circuit, such as the cascode circuit 200. The method 900 includes forming respective wire bond(s) to provide electrical connections from respective signal terminals (signal pins, etc.), or leads 110, of the lead frame 102 to device terminals of transistors and diodes formed on respective semiconductor die 104. Connections for the cascode circuit 200 can be made according to the circuit design shown in FIG. 2 and described above.

At 908, the method 900 includes encapsulating the two-stage amplifier circuit with the molding compound 106, for example, using an injection molding process. In some implementations, e.g., high-power semiconductor device module 100b, the dam bar 500 can be disposed so as to restrict or block a flow of liquid molding compound from exiting the mold before the molding compound 106 solidifies. After the encapsulation operation is complete, the dam bar 500 can be removed, for example, by cutting using a trimming tool.

At 910, the method 900 includes attaching the resin coated copper (RCC) layer 602 to the split lead frame body sections 108*a,b* of the lead frame 102 using, for example, an epoxy adhesive. In some examples, the adhesive can be a thermally conductive and electrically conductive epoxy, such as a silver-filled epoxy. In other implementations, the adhesive can be a thermally conductive, but electrically insulative adhesive material, e.g., a thermal interface material. In some implementations, such as the example shown, the RCC layer 602 includes a screw hole 302. In some implementations, the RCC layer 602 is not split. That is, the RCC layer 602 is one continuous piece that spans the gap g.

At 912, the method 900 includes attaching the backplane 604 to the RCC layer 602, using, for example, an epoxy adhesive. In some examples, the adhesive can be a thermally conductive and electrically conductive epoxy, such as a silver-filled epoxy. In other implementations, the adhesive can be a thermally conductive, but electrically insulative adhesive material, e.g., a thermal interface material. In some implementations, such as the example shown, the backplane 604 includes a screw hole 302. In some implementations, the backplane 604 is not split. That is, the backplane 604 is one continuous piece that spans the gap g.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. An apparatus, comprising:
a split lead frame having split lead frame body sections separated by an isolation region, wherein the split lead frame body sections include a first split lead frame body section and a second split lead frame body section;
a die attach pad (DAP) on an upper surface of each of the split lead frame body sections;
an electronic circuit including a first device in a first die coupled to a second device in a second die, the first die and the second die arranged side-by-side on the upper surface, the first die being disposed on the first split lead frame body section and the second die being disposed on the second split lead frame body section;
an insulator in contact with the upper surface and a lower surface of the split lead frame; and
a dummy lead extending from at least one of the split lead frame body sections.

2. The apparatus of claim 1, wherein the first die is made of silicon and the second die is made of silicon carbide (SiC).

3. The apparatus of claim 1, wherein the insulator is a molding compound disposed within the isolation region.

4. The apparatus of claim 3, further comprising a dam bar disposed in each of the split lead frame body sections to block flow of the molding compound.

5. The apparatus of claim 1, wherein the isolation region is less than or equal to 2.0 mm wide.

6. The apparatus of claim 1, wherein the electronic circuit is configured to operate at a voltage up to about 600 V.

7. The apparatus of claim 1, wherein the electronic circuit is a two-stage amplifier.

8. The apparatus of claim 1, wherein the electronic circuit is a SiC based cascode circuit.

9. The apparatus of claim 1, wherein a first section of the first split lead frame body section and a second section of the second split lead frame body section define a single DAP.

10. An apparatus, comprising:
a split lead frame body having an upper surface and a lower surface, the split lead frame body being split into a first split lead frame body section and a second split lead frame body section separated by a gap;
an electronic circuit coupled to the upper surface, the electronic circuit including a first device included in a first die coupled to a second device included in a second die, the first die coupled to a die attach pad (DAP) in the first split lead frame body section and the second die coupled to a DAP in the second split lead frame body section;
an insulating layer coupled to the lower surface of the split lead frame body; and
a temperature sensor included in the second die and electrically coupled to a lead.

11. The apparatus of claim 10, wherein the insulating layer is a resin coated copper layer.

12. The apparatus of claim 10, further comprising a backplane coupled to the insulating layer.

13. The apparatus of claim 10, wherein the gap is an isolation region filled with a molding compound.

14. The apparatus of claim 13, wherein the isolation region is less than or equal to 2.0 mm wide.

15. The apparatus of claim 10, wherein the electronic circuit is an amplifier circuit configured to operate at a high voltage up to about 1700 V.

16. The apparatus of claim 10 further comprising a dummy lead extending from the second split lead frame body section.

17. An apparatus, comprising:

a split lead frame including:

a first split lead frame section including a first body section and at least one first lead extending from the first body section;

a second split lead frame section, separated from the first split lead frame section by a gap, including a second body section and at least one second lead extending from the second body section; and a dummy lead extending from at least one of the first split lead frame section or the second split lead frame section;

a first die attach pad (DAP) on an upper surface of the first body section;

a second DAP on an upper surface of the second body section;

a first die coupled to a surface of the first DAP;

a second die coupled to a surface of the second DAP; and molding material disposed in the gap and isolating the first body section from the second body section.

18. The apparatus of claim 17, wherein the molding material is in contact with an upper surface and a lower surface of the split lead frame.

19. The apparatus of claim 17, wherein the gap is at least 1.6 mm.

20. The apparatus of claim 17, wherein the dummy lead is coupled to the second DAP.

\* \* \* \* \*